US012614893B2

(12) United States Patent
Suga et al.

(10) Patent No.: US 12,614,893 B2
(45) Date of Patent: Apr. 28, 2026

(54) SEMICONDUCTOR OPTICAL DEVICE AND MANUFACTURING METHOD THEREFOR

(71) Applicant: Lumentum Japan, Inc., Sagamihara (JP)

(72) Inventors: Kazuki Suga, Kanagawa (JP); Kouji Nakahara, Tokyo (JP)

(73) Assignee: LumentumRadiant GmbH, Baar (CH)

( * ) Notice: Subject to any disclaimer, the term of this patent is extended or adjusted under 35 U.S.C. 154(b) by 986 days.

(21) Appl. No.: 17/653,745

(22) Filed: Mar. 7, 2022

(65) Prior Publication Data

US 2023/0106955 A1 Apr. 6, 2023

(30) Foreign Application Priority Data

Oct. 1, 2021 (JP) ................................. 2021-163083
Nov. 25, 2021 (JP) ................................. 2021-191093

(51) Int. Cl.
*H01S 5/22* (2006.01)
*H01S 5/223* (2006.01)
*H01S 5/227* (2006.01)
*H01S 5/343* (2006.01)

(52) U.S. Cl.
CPC ............ *H01S 5/2206* (2013.01); *H01S 5/223* (2013.01); *H01S 5/2275* (2013.01); *H01S 5/34366* (2013.01)

(58) Field of Classification Search
CPC ....... H01S 5/2206; H01S 5/223; H01S 5/2275
See application file for complete search history.

(56) References Cited

U.S. PATENT DOCUMENTS

| | | | | |
|---|---|---|---|---|
| 5,568,500 A | * | 10/1996 | Furuya ...................... | H01S 5/16 |
| | | | | 372/46.01 |
| 2013/0208751 A1 | * | 8/2013 | Nakahara .................. | H01S 5/12 |
| | | | | 372/45.011 |
| 2018/0090910 A1 | * | 3/2018 | Nakahara .................. | G02B 6/42 |
| 2021/0044089 A1 | | 2/2021 | Nakahara et al. | |

FOREIGN PATENT DOCUMENTS

| | | | |
|---|---|---|---|
| JP | 2005217195 A | 8/2005 | |
| JP | 2013165133 A | 8/2013 | |
| JP | 2018056212 A | 4/2018 | |
| JP | 2021027310 A | 2/2021 | |

* cited by examiner

*Primary Examiner* — Michael Carter

(74) *Attorney, Agent, or Firm* — Harrity & Harrity, LLP

(57) ABSTRACT

A semiconductor optical device includes: a lower mesa structure extending in a stripe shape and composed of some layers including an active layer; a buried layer configured to bury both sides of the lower mesa structure and made of indium phosphide; and an upper mesa structure extending in a stripe shape and composed of some layers including a bottom layer made of phosphorus-free materials, the bottom layer having a bottom surface protruding from a topmost layer of the lower mesa structure, the bottom surface being in contact with the lower mesa structure and the buried layer.

17 Claims, 12 Drawing Sheets

1

SEMICONDUCTOR OPTICAL DEVICE AND MANUFACTURING METHOD THEREFOR

CROSS-REFERENCE TO RELATED APPLICATIONS

The present application claims priority to Japanese patent applications 2021-163083 filed on Oct. 1, 2021 and 2021-191093 filed on Nov. 25, 2021, the contents of which are hereby expressly incorporated by reference herein.

TECHNICAL FIELD

The present disclosure relates generally to a semiconductor optical device and a method for manufacturing the same.

BACKGROUND

In semiconductor optical devices, a buried heterostructure (BH structure) may be a buried layer, made of a semiconductor layer, that may be provided on both sides of a mesa stripe structure to increase a relaxation oscillation frequency by suppressing lateral diffusion of current. Another structure may be also known, in which only a portion (including a multi quantum well (MQW)) may be buried, instead of the entire mesa stripe structure being buried, to increase an optical confinement factor of the MQW.

In some cases, a semiconductor optical device may have a two-stage structure consisting of a lower mesa structure with a MQW and an upper mesa structure and possibly with a grating layer. The upper mesa structure may be wider in width than the lower mesa structure, whereby a bottom surface of the upper mesa structure may be exposed from the lower mesa structure.

By applying metal organic chemical vapor deposition (MOCVD) to form the buried layer, crystals grow from a substrate and also grow from the exposed bottom surface of the upper mesa structure. Such growth in different directions may generate crystal defects and cavities at interfaces between the crystals, resulting in a decrease in crystallinity of the buried layer, which may lead to a decrease in reliability and characteristics of the semiconductor optical device.

SUMMARY

Some implementations described herein aim to prevent degradation of crystallinity of a buried layer.

In some implementations, a semiconductor optical device includes: a lower mesa structure extending in a stripe shape and composed of some layers including an active layer; a buried layer configured to bury both sides of the lower mesa structure and made of indium phosphide; and an upper mesa structure extending in a stripe shape and composed of some layers including a bottom layer made of phosphorus-free materials, the bottom layer having a bottom surface protruding from a topmost layer of the lower mesa structure, the bottom surface being in contact with the lower mesa structure and the buried layer.

In some implementations, a method for manufacturing a semiconductor optical device includes: forming a mesa stripe structure, the mesa stripe structure including a lower mesa structure extending in a stripe shape and composed of some layers including an active layer, the mesa stripe structure including an upper mesa structure extending in a stripe shape on the lower mesa structure and composed of some layers including a bottom layer, the bottom layer having a bottom surface protruding from a topmost layer of the lower mesa structure, the bottom layer being made of phosphorus-free materials; and after forming the mesa stripe structure, forming a buried layer made of indium phosphide on both sides of the lower mesa structure, by crystal growth, to be in contact with the bottom surface.

DETAILED DESCRIPTION

Figure 1:
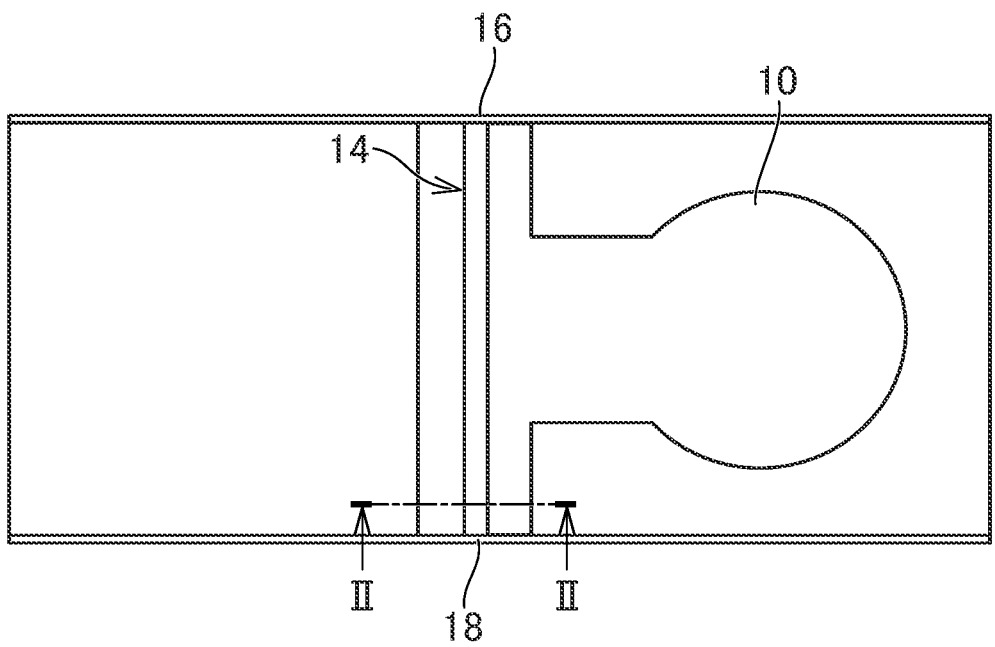
FIG. 1 is a plan view of a semiconductor optical device according to a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
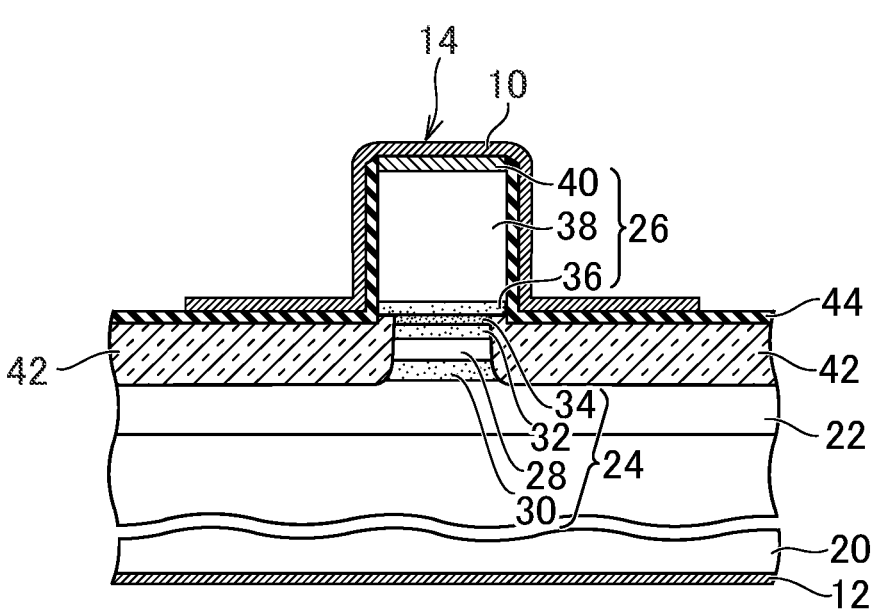
FIG. 2 is a II-II cross-sectional view of the semiconductor optical device in FIG. 1.

FIG. 1 is a plan view of a semiconductor optical device according to a first example implementation. FIG. 2 is a II-II cross-sectional view of the semiconductor optical device in FIG. 1. The semiconductor optical device may be a semiconductor laser. The semiconductor optical device may have an upper electrode 10 and a lower electrode 12 on an upper surface and a lower surface, respectively, to apply a voltage (inject a current) therebetween. This enables a laser beam to be emitted, for example, in a 1.3 µm band or a 1.55 µm band from an end face of a mesa stripe structure 14. A non-reflective coating film 16 made of a dielectric may be formed on the end face on the emitting side. A highly reflective coating film 18 made of a dielectric may be formed on an end face on an opposite side.

The semiconductor optical device may have a substrate 20 made of indium phosphide (InP). A buffer layer 22 (lower cladding layer) made of InP may be laminated on the substrate 20. Part of the upper electrode 10 may be disposed above the buffer layer 22. Therefore, a parasitic capacitance may be generated between the upper electrode 10 and the buffer layer 22. To reduce the parasitic capacitance, one option is to make a distance greater between the upper electrode 10 and the buffer layer 22. The buffer layer 22 may be omitted.

The semiconductor optical device may include the mesa stripe structure 14. At least part of the upper electrode 10 may be on the mesa stripe structure 14. Part of the buffer layer 22 may be a protrusion and may be included in the mesa stripe structure 14. In other words, the buffer layer 22 may have an upper surface, part of which other than the protrusion may be lower. The mesa stripe structure 14 may have a laminate structure of at least two stages with different widths. The mesa stripe structure 14 may include, in order from the buffer layer 22, a lower mesa structure 24 and an upper mesa structure 26 with a wider width than the lower mesa structure 24.

The lower mesa structure 24 may extend in a stripe shape. The lower mesa structure 24 may be composed of some layers. The lower mesa structure 24 may be composed of a laminate including, in order from the buffer layer 22, a lower SCH (Separate Confinement Heterostructure) layer 30, an active layer 28, an upper SCH layer 32, and a topmost layer 34. The active layer 28 may be an MQW or a bulk material. The topmost layer 34 of the lower mesa structure 24 may be made of InP like the buffer layer 22. The lower SCH layer 30, the active layer 28, and the upper SCH layer 32 are thick enough to ensure particular optical properties.

Since a 3 dB bandwidth of a directly modulated semiconductor laser is limited by its relaxation oscillation frequency fr to 1.55 fr, necessitating improvement of the relaxation oscillation frequency fr for a higher-speed operation. In the semiconductor laser with the MQW as the active layer 28, a following relationship may be established between the relaxation oscillation frequency fr, an optical confinement factor $\Gamma_{QW}$ per quantum well, a width $W_a$ of the active layer 28, and a drive current $I_m$. Here, the drive current $I_m$ may be a current of an injection current minus a threshold current.

$$f_r \propto \sqrt{\frac{\Gamma_{QW}}{W_a} I_m}$$

Therefore, by making the width $W_a$ of the active layer 28 smaller, a value of the optical confinement factor $\Gamma_{QW}/W_a$ becomes larger, the relaxation oscillation frequency fr becomes larger, and the 3 dB bandwidth improves.

The upper mesa structure 26 may extend in a stripe shape. The upper mesa structure 26 may be composed of some layers. The upper mesa structure 26 may have a bottom layer 36 made of phosphorus (P) free materials (e.g., InGaAlAs, InAlAs, and/or InGaAs). The bottom layer 36 may have a bottom surface that protrudes from the topmost layer 34 of the lower mesa structure 24. The bottom surface may be in contact with the lower mesa structure 24. An upper cladding layer 38 made of InP and a contact layer 40 may be provided above the bottom layer 36.

Both sides of the lower mesa structure 24 may be buried with a buried layer 42. The buried layer 42 may be made of a same material as the substrate 20 from a viewpoint of crystallinity and stress. The buried layer 42 may be made of InP. The buried layer 42 may be made of p-type InP, n-type InP, high resistivity type InP with Fe or Ru as dopants, or may be a laminate of materials selected from a group consisting of p-type InP, n-type InP, and high-resistivity type InP. A base (buffer layer 22 on the substrate 20) under the buried layer 42 may be also made of InP.

The buried layer 42 may be disposed on the both sides of the lower mesa structure 24, but may not be adjacent to the upper mesa structure 26. In such a structure, when a portion (upper mesa structure 26) not buried with the buried layer 42 is made larger in width than the active layer 28, the value of the optical confinement factor $\Gamma_{QW}/W_a$ becomes larger, leading to an increase of the relaxation oscillation frequency fr and an improvement of the 3 dB bandwidth.

As described above, the buffer layer 22 may have the upper surface, an area of which other than the protrusion (part of the mesa stripe structure 14) may be lower, where the buried layer 42 may be thicker. When the buried layer 42 is semi-insulating, a distance between the upper electrode 10 above it and the buffer layer 22 may be larger, and the parasitic capacitance may be smaller.

The bottom surface (e.g., an edge thereof) of the bottom layer 36 of the upper mesa structure 26 may be in contact with the buried layer 42. The buried layer 42 may be thickest at a portion in contact with the bottom surface of the bottom layer 36 of the upper mesa structure 26. The portion of the buried layer 42 in contact with the bottom surface of the bottom layer 36 may be a protrusion.

For example, when the buried layer 42 is made of Fe—InP, dopants contained in the lower SCH layer 30 or the upper SCH layer 32 interdiffuse with Fe. As a result, the buried layer 42 becomes an effectively thin high-resistance layer (semi-insulation layer) at a portion adjacent to the lower mesa structure 24, increasing the parasitic capacitance. Therefore, by making the thickness of the buried layer 42 greater than that of other areas just on the both sides of the lower mesa structure 24, an effect of the increase in parasitic capacitance can be suppressed. This may be an effect of the bottom layer 36 of the upper mesa structure 26 being larger in width than the topmost layer 34 of the lower mesa structure 24.

A side surface of the upper mesa structure 26 and an upper surface of the buried layer 42 may be covered with an insulation layer 44. The insulation layer 44 may be made of, for example, $SiO_2$. The upper electrode 10 may be on a surface of the insulation layer 44. The insulation layer 44 may have an opening or a slit above the upper mesa structure 26, and the upper electrode 10 may be electrically and physically connected to the contact layer 40.

The insulation layer 44 may have a contact surface with the buried layer 42. The contact surface may be lower than the bottom surface of the bottom layer 36 of the upper mesa structure 26. The insulation layer 44 may be not in contact with the topmost layer 34 of the lower mesa structure 24. Part of the buried layer 42 may be interposed between the topmost layer 34 of the lower mesa structure 24 and the insulation layer 44.

Figure 3A:
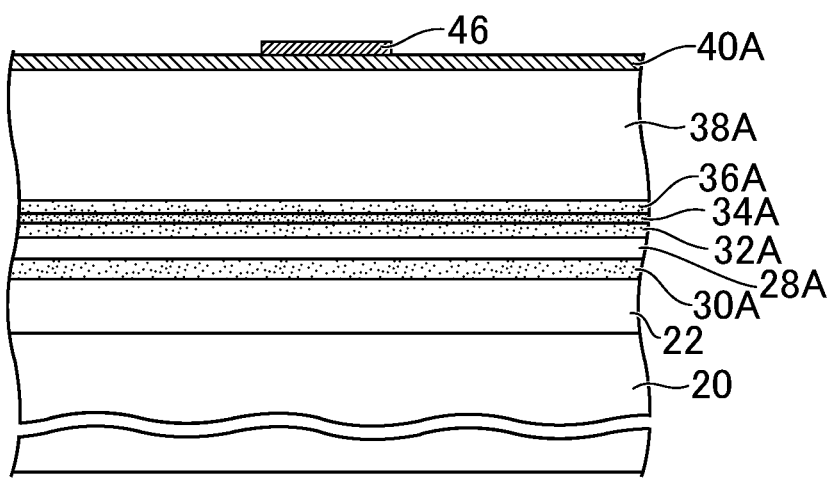
FIG. 3A is a diagram of a method of manufacturing the semiconductor optical device in FIGS. 1-2.

FIGS. 3A to 3G are diagrams of a method of manufacturing the semiconductor optical device in FIGS. 1-2. The manufacturing method of the semiconductor optical device includes forming the mesa stripe structure 14. The formation of the mesa stripe structure 14 includes forming multiple layers (FIG. 3A). The buffer layer 22 as the base under the multiple layers may be made of InP. When the buffer layer 22 is omitted from the structure, the substrate 20 made of InP may be the base. The upper mesa structure 26 and the lower mesa structure 24 shown in FIG. 2 are formed from the multiple layers.

The formation of the multiple layers may be performed using metal organic chemical vapor deposition (MOCVD) successively in a batch process or in multiple processes. The multiple layers include a layer 30A to be the lower SCH layer 30, a layer 28A to be the active layer 28, a layer 32A to be the upper SCH layer 32, a layer 34A to be the topmost layer 34 of the lower mesa structure 24, a layer 36A to be the bottom layer 36 of the upper mesa structure 26, a layer 38A to be the upper cladding layer 38, and a layer 40A to be the contact layer 40. The layer 30A to be the lower SCH layer 30 and the layer 32A to be the upper SCH layer 32 may be made of InGaAsP, InGaAlAs, or InAlAs. The layer 28A to be the active layer 28 may be made of a tetranary compound such as InGaAsP or InGaAlAs. The layer 34A to be the topmost layer 34 of the lower mesa structure 24 may be made of InP. The layer 36A to be the bottom layer 36 of the upper mesa structure 26 may be made of phosphorus (P) free materials (e.g., InGaAlAs).

Along the mesa stripe structure 14 (optical axis direction), a first coating film 46 may be formed on the multiple layers. Here, the first coating film 46 may be SiO$_2$. The first coating film 46 may be formed in an area corresponding to the upper mesa structure 26 (FIG. 2).

Figure 3B:
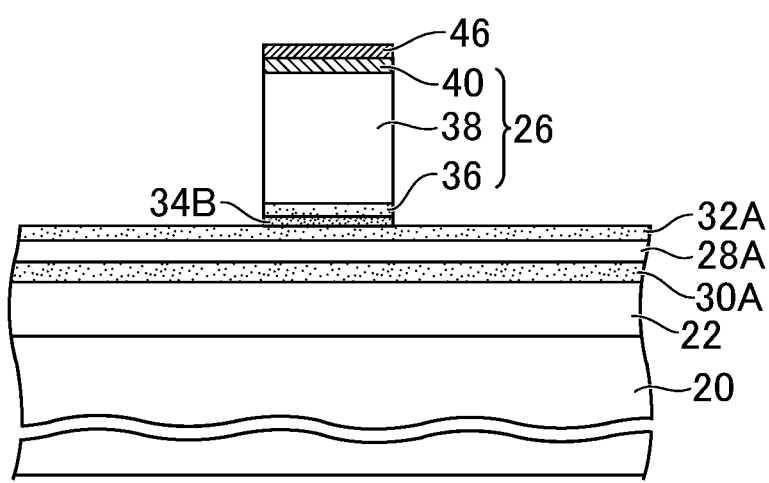
FIG. 3B is a diagram of the method of manufacturing the semiconductor optical device in FIGS. 1-2.

As shown in FIG. 3B, an etching may be performed on the laminate to be the upper mesa structure 26 and the layer 34A to be the topmost layer 34 (FIG. 2) of the lower mesa structure 24. By the etching using the first coating film 46 as a mask, the laminate to be the upper mesa structure 26 and the layer 34A to be the topmost layer 34 of the lower mesa structure 24 are removed, leaving the area corresponding to the upper mesa structure 26. As a result, the upper mesa structure 26 is formed.

Figure 3C:
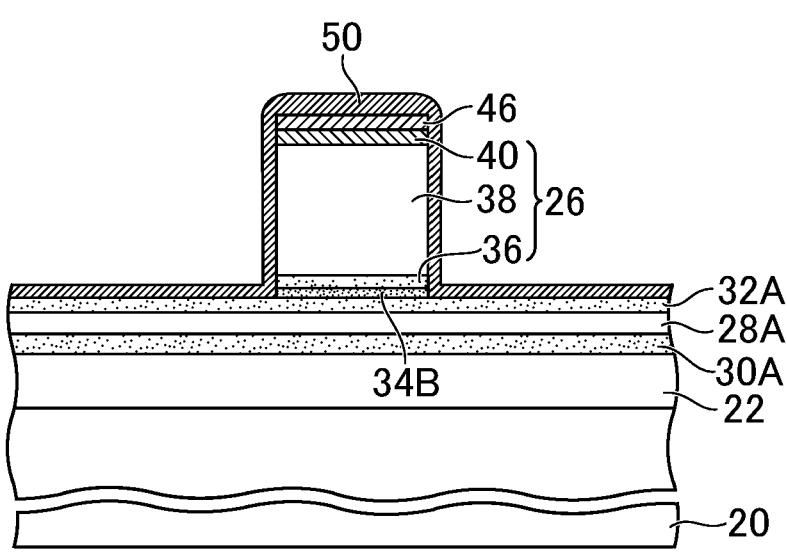
FIG. 3C is a diagram of the method of manufacturing the semiconductor optical device in FIGS. 1-2.

As shown in FIG. 3C, a second coating film 50 may be placed to overlap with the first coating film 46 remaining after the previous etching may be completed. The second coating film 50 covers the upper surface and the side surface of the upper mesa structure 26, also covers the side surface of the etched layer 34B to be the topmost layer 34 of the lower mesa structure 24, and further covers the upper surface of the layer 32A to be the second top layer (upper SCH layer 32) of the lower mesa structure 24. What is on the upper surface of the upper mesa structure 26 may be thick because the first coating film 46 and the second coating film 50 overlap thereon, while what are in other areas may be thin because only the second coating film 50 is formed therein.

Figure 3D:
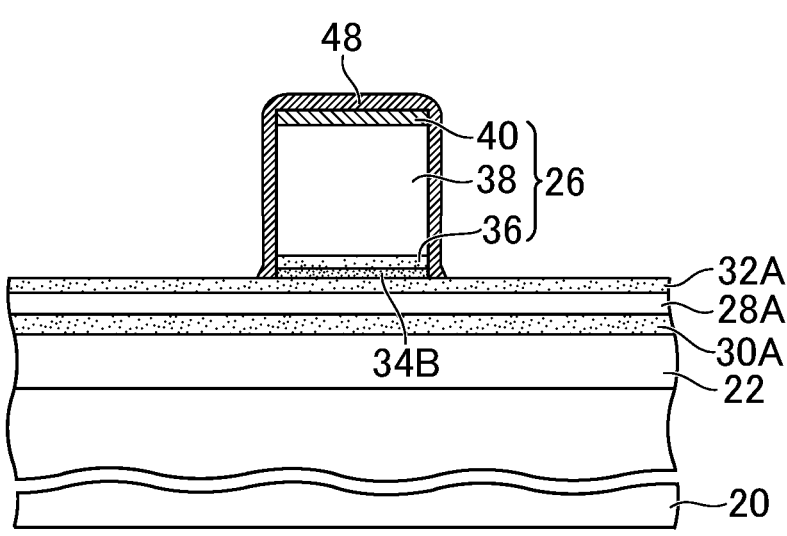
FIG. 3D is a diagram of the method of manufacturing the semiconductor optical device in FIGS. 1-2.

As shown in FIG. 3D, the first coating film 46 and the second coating film 50 may be etched to form an etching mask 48. The etching mask 48 covers the area corresponding to the upper mesa structure 26. Here, the etching mask 48 may be SiO$_2$.

When an anisotropic dry etching is performed in a vertical direction on the first coating film 46 and the second coating film 50 laminated, the etching progresses on a horizontal plane and the second coating film 50 is removed, but the first coating film 46 remains. The etching mask 48 formed thereby covers the upper surface and the side surface of the upper mesa structure 26, and also covers the etched layer 34B to be the topmost layer 34 of the lower mesa structure 24, but exposes other areas.

The etching mask 48 may have a fillet shape (eave shape) at a portion adjacent to the side surface of the etched layer 34B to be the topmost layer 34 of the lower mesa structure 24. This may be formed by patterning with a stepper or an electron beam lithography and then performing an anisotropic dry etching. Alternatively, it may be formed by controlling the film thickness of the second coating film 50.

Figure 3E:
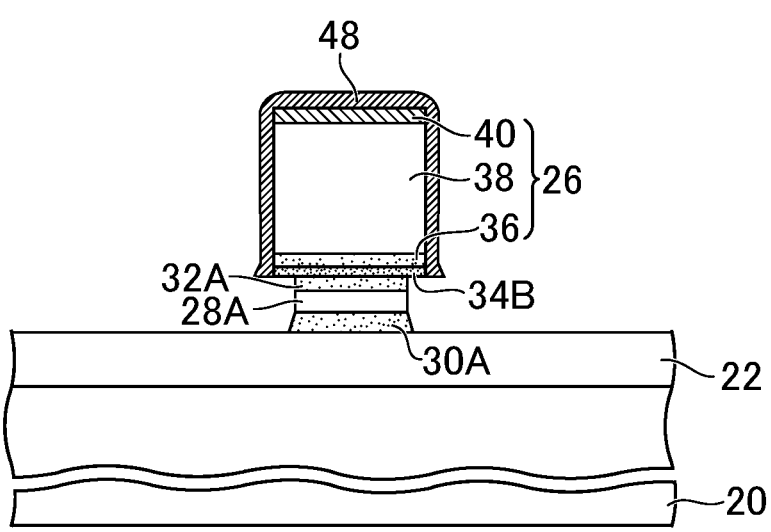
FIG. 3E is a diagram of the method of manufacturing the semiconductor optical device in FIGS. 1-2.

As shown in FIG. 3E, a first selective etching (e.g., wet etching) may be performed through the etching mask 48. In the first selective etching, an etching reaction to the topmost layer 34 of the lower mesa structure 24 may be slow, while another etching reaction to the laminate to be layers other than the topmost layer 34 of the lower mesa structure 24 may be active. The first selective etching may be performed, leaving an area corresponding to the lower mesa structure 24.

Specifically, the layer 30A to be the lower SCH layer 30, the layer 28A to be the active layer 28, and the layer 32A to be the upper SCH layer 32 may be selectively etched. This allows the layers below the topmost layer 34 of the lower mesa structure 24 to be formed to have a narrower width than the upper mesa structure 26. The width depends on etching time. A height of the portion to be etched may be a distance between the layers (buffer layer 22, etched layer 34B) of materials whose etching reaction may be slow.

The buffer layer 22 may be hardly etched. Since the etched layer 34B to be the topmost layer 34 of the lower mesa structure 24 may be also hardly etched, the bottom layer 36 of the upper mesa structure 26 may be not etched, either. The etched layer 34B may have a function of preventing impact on the shape of the upper mesa structure 26. As a result, a semiconductor optical device having excellent reliability and characteristics can be manufactured.

Figure 3F:
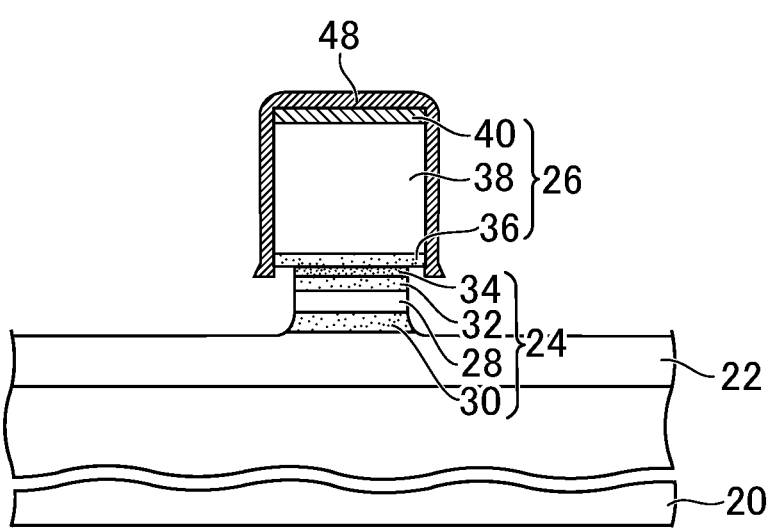
FIG. 3F is a diagram of the method of manufacturing the semiconductor optical device in FIGS. 1-2.

As shown in FIG. 3F, a second selective etching may be performed through the etching mask 48. In the second selective etching, an etching reaction to the bottom layer 36 of the upper mesa structure 26 may be slow, while another etching reaction to the etched layer 34B to be the topmost layer 34 of the lower mesa structure 24 may be active. The second selective etching may be performed, leaving an area corresponding to the lower mesa structure 24. In the second selective etching, the base under the multiple layers may be etched.

For example, a wet etching may be performed with an aqueous solution (e.g., mixture of hydrochloric acid, phosphoric acid, and water) that selectively etches InP. Thereby, the buffer layer 22 and the etched layer 34B to be the topmost layer 34 of the lower mesa structure 24 are etched. Here, the bottom layer 36 of the upper mesa structure 26 may be made of materials that do not contain phosphorus (P) as a constituent element. Therefore, the etching stops at a boundary between the topmost layer 34 of the lower mesa structure 24 and the bottom layer 36 of the upper mesa structure 26, and the upper mesa structure 26 may be not etched. By the above processes, the mesa stripe structure 14 including the upper mesa structure 26 and the lower mesa structure 24 may be formed.

Figure 3G:
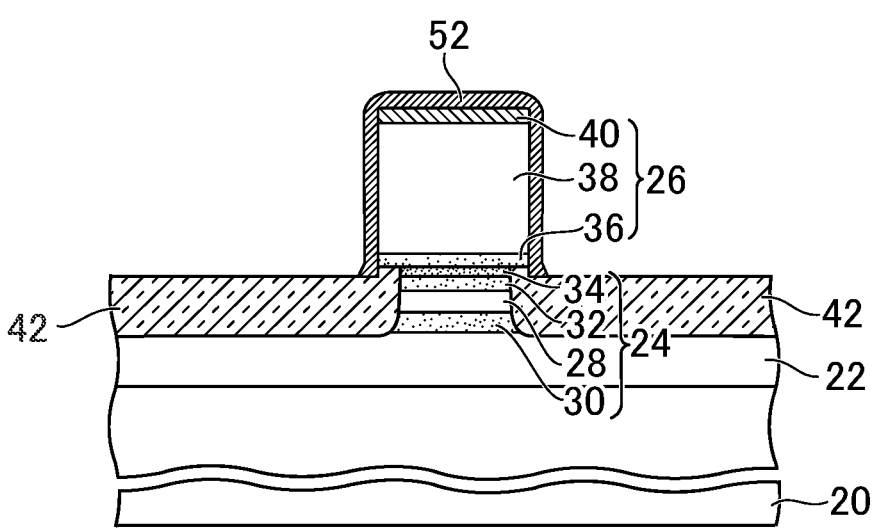
FIG. 3G is a diagram of the method of manufacturing the semiconductor optical device in FIGS. 1-2.

As shown in FIG. 3G, after the mesa stripe structure 14 is formed, the buried layer 42 may be formed on both sides of the lower mesa structure 24 and in contact with the bottom surface of the bottom layer 36 of the upper mesa structure 26. The formation may be performed by crystal growth (e.g., MOCVD).

The crystal growth may be performed with the upper mesa structure 26, except for the bottom surface, covered with the patterning mask 52. Here, the etching mask 48 described above may be left and used as the patterning mask 52. The patterning mask 52 protrudes along the side of the upper mesa structure 26 to exceed the bottom surface. The patterning mask 52, at a position spaced from the topmost layer 34 of the lower mesa structure 24, protrudes in a direction away from the topmost layer 34.

In the present example implementation, while InP grows from a surface of the buffer layer 22, the bottom layer 36 of the upper mesa structure 26 may be materials that do not contain phosphorus (P) as a constituent element, whereby InP does not grow from the bottom surface thereof. Therefore, no crystal defects or cavities are generated in the buried layer 42, bringing excellent reliability and characteristics. Even when the constituent elements constituting the lower SCH layer 30, the active layer 28, and the upper SCH layer 32 do not contain phosphorus, InP will grow on the side due to the crystal planes.

The present example implementation may be particularly effective when the buffer layer 22 (or the substrate 20 when there may be no buffer layer 22), the topmost layer 34 of the lower mesa structure 24, and the buried layer 42 are the same materials (InP). Here, the same materials mean that host materials (basic materials) are the same, irrespective of a difference in a guest material (e.g., dopant).

The patterning mask 52 may be removed, and then the insulation layer 44 may be formed, covering the upper surface and both sides of the upper mesa structure 26, and the upper surface of the buried layer 42 (FIG. 2). Thereafter, on the upper surface of the upper mesa structure 26, part of the insulation layer 44 may be removed to expose the upper surface of the contact layer 40, and the upper electrode 10 may be formed by vapor deposition. The upper electrode 10 may be electrically and physically connected to the contact layer 40. The lower electrode 12 may be formed also on a lower side of the substrate 20. Thus, the semiconductor optical device may be completed.

Figure 4:
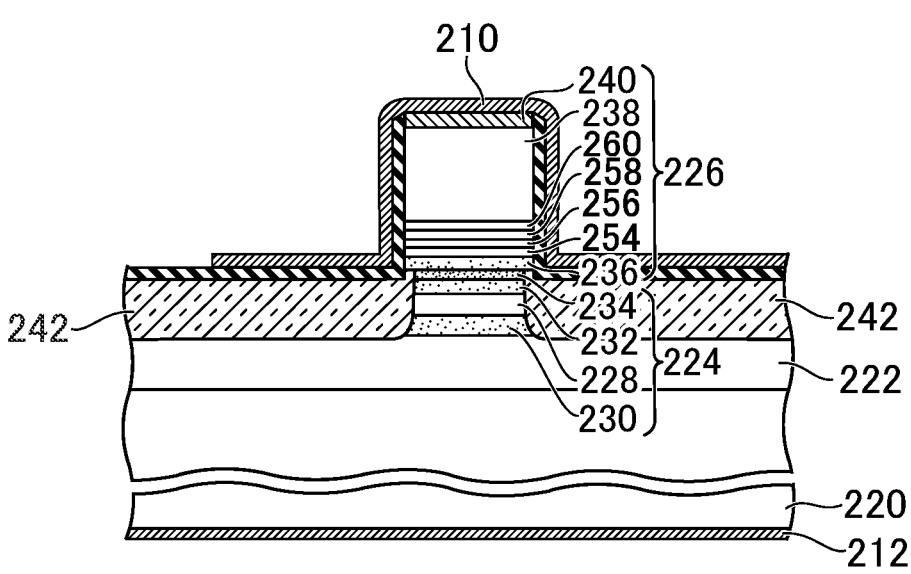
FIG. 4 is a cross-sectional view of a semiconductor optical device according to a second example implementation.

FIG. 4 is a cross-sectional view of a semiconductor optical device according to a second example implementation. The semiconductor optical device may be any one of a distributed feedback (DFB) laser, a distributed Bragg reflector (DBR) laser, or a distributed reflector (DR) laser. A p-type InP buffer layer 222 may be laminated on the substrate 220 made of p-type InP.

The lower mesa structure 224 may be composed of the laminate including the p-type lower SCH layer 230, the active layer 228 as an undoped strained InGaAlAs MQW, the n-type upper SCH layer 232, and the n-type InP topmost layer 234 of the lower mesa structure 224.

The upper mesa structure 226 may be composed of the laminate including, in order from the lower mesa structure 224, the bottom layer 236, a first interlayer semiconductor layer 254 made of a n-type InP layer, a diffraction grating layer 256 made of n-type InGaAsP, a second interlayer semiconductor layer 258 made of an n-type InP layer, an adjustment semiconductor layer 260 made of n-type InGaAsP, an upper cladding layer 238 made of n-type InP, and the n-type contact layer 240. Note that the p-type and n-type may be reversed. The upper electrode 210 may have a three-layer structure of Ti/Pt/Au from the side in contact with the contact layer 240. The lower electrode 212 may be made of AuZn-based materials.

Similar to the first example implementation, the bottom layer 236 of the upper mesa structure 226 may be made of materials that do not contain phosphorus (P) as the constituent element, enabling formation of the buried layer 242 having excellent crystallinity by the processes described in the first example implementation.

This example implementation differs from the first example implementation in that a diffraction grating may be included in the upper mesa structure 226. The first interlayer semiconductor layer 254, the diffraction grating layer 256, and the second interlayer semiconductor layer 258 may be provided to form a floating-type diffraction grating. The diffraction grating layer 256 may have a periodic diffraction grating, and a $\lambda/4$ shift structure may be introduced in a direction perpendicular to a paper surface, for example.

The semiconductor optical device achieves an effect of improving the relaxation oscillation frequency fr due to the increase in the $\Gamma_{QW}/W_a$ in the active layer 228 by narrowing the width of the lower mesa structure 224. However, the semiconductor optical device may also be a laser device, and the value of the coupling coefficient k of the diffraction grating may also be an important parameter in terms of other characteristics of the laser. For example, the coupling coefficient k may influence the optical feedback tolerance and the side mode suppression ratio.

The adjustment semiconductor layer 260 may be a layer to increase the coupling coefficient k of the diffraction grating. The adjustment semiconductor layer 260 may be composed of materials having a higher refractive index than the upper cladding layer 238, and the adjustment semiconductor layer 260 makes it possible to adjust k. The other configuration is the same as that of the semiconductor optical device in the first example implementation.

Figure 5:
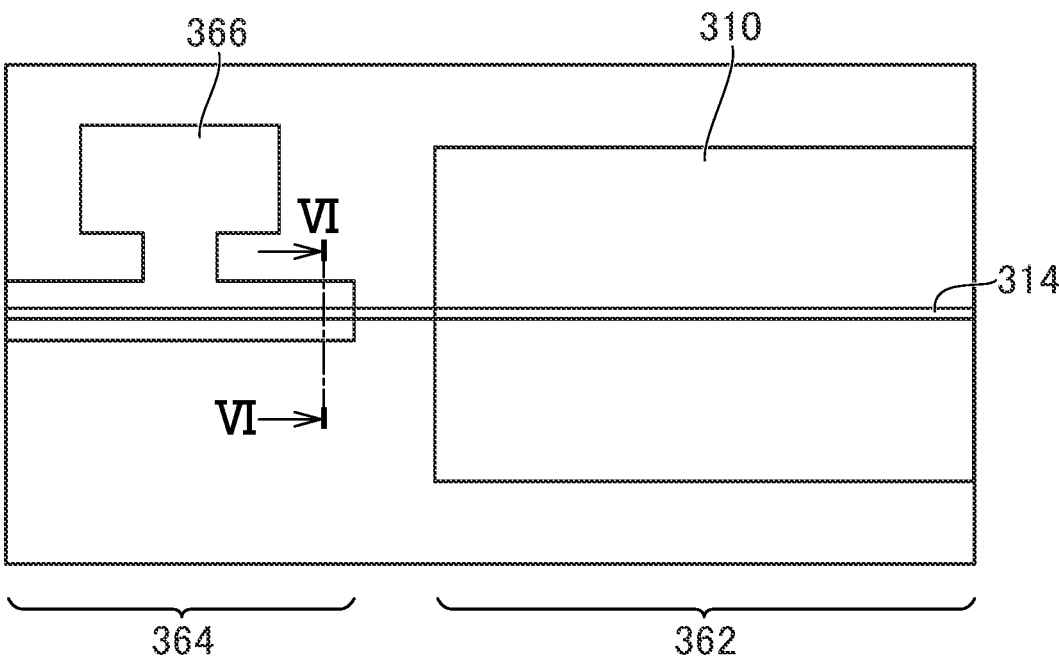
FIG. 5 is a plan view of a semiconductor optical device according to a third example implementation.
Figure 6:
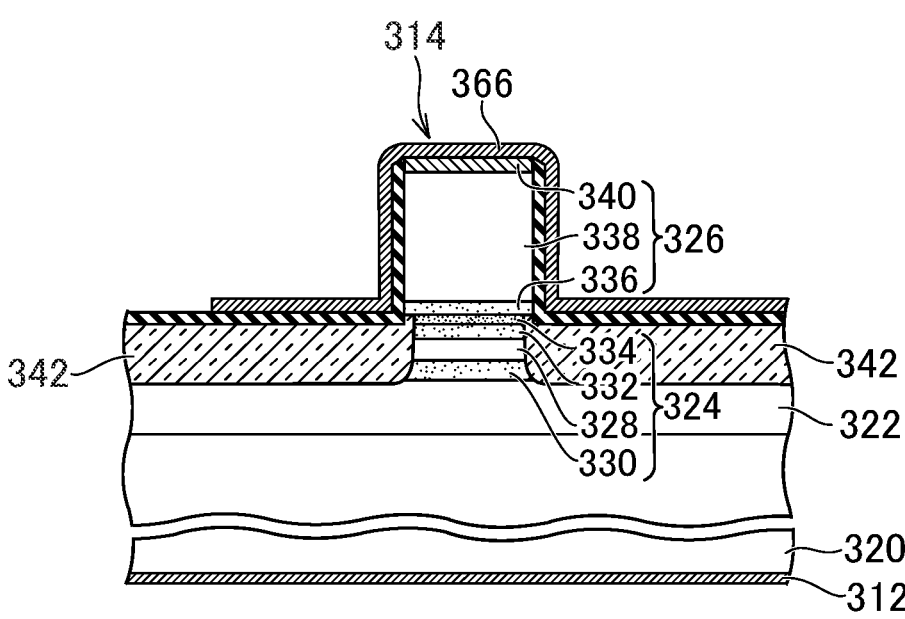
FIG. 6 is a VI-VI cross-sectional view of the semiconductor optical device in FIG. 5.

FIG. 5 is a plan view of a semiconductor optical device according to a third example implementation. FIG. 6 is a VI-VI cross-sectional view of the semiconductor optical device in FIG. 5. The semiconductor optical device is a distributed feedback laser integrated with electro-absorption modulator (EA-DFB laser) in which the semiconductor laser 362 and a electro-absorption type optical modulator 364 are integrated.

An n-type InP buffer layer 322 may be laminated on the substrate 320 made of n-type InP. The lower mesa structure 324 may be composed of a laminate including the n-type lower SCH layer 330, the absorption layer 328 as the MQW made of the undoped strained InGaAlAs, the p-type upper SCH layer 332, and the p-type InP topmost layer 334 of the lower mesa structure 324. The upper mesa structure 326 may be composed of a laminate including, in order from the lower mesa structure 324, the bottom layer 336, the upper cladding layer 338 made of p-type InP, and the p-type contact layer 340. Note that the p-type and the n-type may be reversed.

In addition to the upper electrode 310 of the semiconductor laser 362, there may be an upper electrode 366 of the electro-absorption type optical modulator 364. The lower electrode 312 may be an electrode common to the semiconductor laser 362 and the electro-absorption type optical modulator 364, or may be a separate electrode. The lower electrode 312 may be formed on the lower surface of the substrate 320.

The semiconductor optical device may have the mesa stripe structure 314 extending through both the semiconductor laser 362 and the electro-absorption optical modulator 364. There may be a bulk waveguide structure between the semiconductor laser 362 and the electro-absorption optical modulator 364. Alternatively, no bulk waveguide structure may be included, and the semiconductor laser 362 and the electro-absorption type optical modulator 364 may be directly connected. The mesa stripe structure 314 may be composed of two stages. The mesa stripe structure 314 of the semiconductor laser 362 may be, for example, the same structure as the semiconductor optical device described in the second example implementation.

In the electro-absorption optical modulator 364, the lower mesa structure 324 may be sandwiched by the buried layer 342. Narrowing the width of the absorption layer 328 enhances the electric field strength per unit volume of the absorption layer 328, therefore being advantageous in terms of low-voltage drive. However, when the width of the upper mesa structure 326 may be narrowed, the resistance becomes larger. Therefore, by making the upper mesa structure 326 wider than the lower mesa structure 324, the increase in resistance can be suppressed while the electric field strength of the absorption layer 328 can be greater.

Also in the present example implementation, the bottom layer 336 of the upper mesa structure 326 may be composed of materials (e.g., InGaAlAs) that does not contain phosphorus (P) as the constituent element, and the buried layer 342 having excellent crystallinity can be formed by the processes described in the first example implementation.

In a first implementation, a semiconductor optical device includes: a lower mesa structure 24 extending in a stripe shape and composed of some layers including an active layer 28 or an absorption layer 328; a buried layer 42 configured to bury both sides of the lower mesa structure 24 and made of indium phosphide; and an upper mesa structure 26 extending in a stripe shape and composed of some layers including a bottom layer 36 made of phosphorus-free materials, the bottom layer 36 having a bottom surface protruding from a topmost layer 34 of the lower mesa structure 24, the bottom surface being in contact with the lower mesa structure 24 and the buried layer 42.

Since the bottom layer 36 of the upper mesa structure 26 is composed of materials that does not contain phosphorus, it is difficult for indium phosphide crystals to grow from the bottom surface thereof. This can prevent degradation of the crystallinity of the buried layer 42 made of indium phosphide.

In a second implementation, alone or in combination with the first implementation, the buried layer 42 is thickest at a portion in contact with the bottom surface of the bottom layer 36.

In a third implementation, alone or in combination with one or more of the first and second implementations, wherein the portion of the buried layer in contact with the bottom surface of the bottom layer 36 is a protrusion.

In a fourth implementation, alone or in combination with one or more of the first through third implementations, the semiconductor optical device further includes an insulation layer 44 covering a side surface of the upper mesa structure 26 and an upper surface of the buried layer 42.

In a fifth implementation, alone or in combination with one or more of the first through fourth implementations, the buried layer 42 has a portion between the topmost layer 34 of the lower mesa structure 24 and the insulation layer 44, and the insulation layer 44 is not in contact with the topmost layer 34.

In a sixth implementation, alone or in combination with one or more of the first through fifth implementations, the insulation layer 44 has a contact surface with the buried layer 42, and the contact surface is lower than the bottom surface of the bottom layer 36.

In a seventh implementation, alone or in combination with one or more of the first through sixth implementations, a base under the buried layer 42 is made of indium phosphide.

In an eighth implementation, alone or in combination with one or more of the first through seventh implementations, the base under the buried layer 42 is a buffer layer 22 on a substrate 20.

In a ninth implementation, alone or in combination with one or more of the first through eighth implementations, wherein material of the bottom layer 36 is any one of InGaAlAs, InAlAs, or InGaAs.

In a tenth implementation, a method for manufacturing a semiconductor optical device includes: forming a mesa stripe structure 14, the mesa stripe structure 14 including a lower mesa structure 24 extending in a stripe shape and composed of some layers including an active layer 28 or an absorption layer 328, the mesa stripe structure 14 including an upper mesa structure 26 extending in a stripe shape on the lower mesa structure 24 and composed of some layers including a bottom layer 36, the bottom layer 36 having a bottom surface protruding from a topmost layer 34 of the lower mesa structure 24, the bottom layer 36 being made of phosphorus-free materials; and after forming the mesa stripe structure 14, forming a buried layer 42 made of indium phosphide on both sides of the lower mesa structure 24, by crystal growth, to be in contact with the bottom surface.

Since the bottom layer 36 of the upper mesa structure 26 is composed of materials that does not contain phosphorus, it is difficult for indium phosphide crystals to grow from the bottom surface thereof. This can prevent degradation of the crystallinity of the buried layer 42 made of indium phosphide.

In an eleventh implementation, alone or in combination with the tenth implementation, the crystal growth may be performed with the upper mesa structure 26, except for the bottom surface, covered with a patterning mask 52.

In an twelfth implementation, alone or in combination with one or more of the tenth through eleventh implementations, the patterning mask 52 protrudes along a side surface of the upper mesa structure 26 to exceed the bottom surface.

In a thirteenth implementation, alone or in combination with one or more of the tenth through twelfth implementations, the patterning mask 52, at a position spaced from the topmost layer 34 of the lower mesa structure 24, protrudes in a direction away from the topmost layer 34.

In a fourteenth implementation, alone or in combination with one or more of the tenth through thirteenth implementations, forming the mesa stripe structure 14 includes: depositing multiple layers to be the upper mesa structure 26 and the lower mesa structure 24; performing an etching on a laminate to be the upper mesa structure 26 and a layer 34A to be the topmost layer 34 of the lower mesa structure 24, leaving an area corresponding to the upper mesa structure 26; performing a first selective etching whose reaction is slow for the topmost layer 34 of the lower mesa structure 24 but is active for a laminate to be layers of the lower mesa structure 24 other than the topmost layer 34; and performing a second selective etching whose reaction is slow for the bottom layer 36 of the upper mesa structure 26 but is active for the etched layer 34B to be the topmost layer 34 of the lower mesa structure 24, wherein the first selective etching and the second selective etching are performed to leave an area corresponding to the lower mesa structure 24.

In a fifteenth implementation, alone or in combination with one or more of the tenth through fourteenth implementations, the method further including forming an etching mask 48 to cover the area corresponding to the upper mesa structure 26, before performing the first selective etching.

In a sixteenth implementation, alone or in combination with one or more of the tenth through fifteenth implementations, a base on which the multiple layers are deposited and the layer 34A to be the topmost layer 34 are made of indium phosphide, and the base under the multiple layers is etched in the second selective etching.

The example implementations described above are not limited and different variations are possible. The structures explained in the example implementations may be replaced with substantially the same structures and other structures that can achieve the same effect or the same objective.

The foregoing disclosure provides illustration and description, but may be not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor optical device comprising:
a lower mesa structure extending in a stripe shape and composed of some layers including an active layer;
a buried layer configured to bury both sides of the lower mesa structure and made of indium phosphide; and
an upper mesa structure extending in a stripe shape and composed of some layers including a bottom layer made of phosphorus-free materials, the bottom layer having a bottom surface protruding from a topmost layer of the lower mesa structure, the bottom surface being in contact with the lower mesa structure and the buried layer,
wherein the buried layer has a top horizontal surface that extends laterally outward beyond edges of the upper mesa structure,
wherein the buried layer includes a protrusion extending above, with respect to a substrate of the semiconductor optical device, the top horizontal surface, and
wherein the protrusion is in direct contact with the bottom surface of the bottom layer.

2. The semiconductor optical device according to claim 1, wherein the buried layer is thickest at the protrusion.

3. The semiconductor optical device according to claim 2, wherein a side surface of the protrusion that is in contact with the bottom surface of the bottom layer is in contact with lower mesa structure.

4. The semiconductor optical device according to claim 1, further comprising an insulation layer covering a side surface of the upper mesa structure and an upper surface of the buried layer.

5. The semiconductor optical device according to claim 4, wherein
the protrusion is between the topmost layer of the lower mesa structure and the insulation layer, and
the insulation layer is not in contact with the topmost layer.

6. The semiconductor optical device according to claim 4, wherein
the insulation layer has a contact surface with the top horizontal surface of the buried layer, and
the contact surface is lower than the bottom surface of the bottom layer.

7. The semiconductor optical device according to claim 1, wherein a base under the buried layer is made of indium phosphide.

8. The semiconductor optical device according to claim 7, wherein the base under the buried layer is a buffer layer on the substrate.

9. The semiconductor optical device according to claim 1, wherein material of the bottom layer is any one of InGaAlAs, InAlAs, or InGaAs.

10. The semiconductor optical device according to claim 1, wherein the buried layer has a crystal structure.

11. A method for manufacturing a semiconductor optical device, the method comprising:
forming a mesa stripe structure, the mesa stripe structure including a lower mesa structure extending in a stripe shape and composed of some layers including an active layer, the mesa stripe structure including an upper mesa structure extending in a stripe shape on the lower mesa structure and composed of some layers including a bottom layer, the bottom layer having a bottom surface protruding from a topmost layer of the lower mesa structure, the bottom layer being made of phosphorus-free materials; and
forming a buried layer made of indium phosphide on both sides of the lower mesa structure, by crystal growth, to be in contact with the bottom surface,
wherein the crystal growth is performed with the upper mesa structure, except for the bottom surface, covered with a patterning mask.

12. The method for manufacturing the semiconductor optical device according to claim 11, wherein the patterning mask protrudes along a side surface of the upper mesa structure to exceed the bottom surface.

13. The method for manufacturing the semiconductor optical device according to claim 12, wherein the patterning mask, at a position spaced from the topmost layer of the lower mesa structure, protrudes in a direction away from the topmost layer.

14. The method for manufacturing the semiconductor optical device according to claim 11, wherein forming the mesa stripe structure comprises:

depositing multiple layers to be the upper mesa structure and the lower mesa structure;

performing an etching on a laminate to be the upper mesa structure and a layer to be the topmost layer of the lower mesa structure, leaving an area corresponding to the upper mesa structure;

performing a first selective etching whose reaction is slow for the topmost layer of the lower mesa structure but is active for a laminate to be layers of the lower mesa structure other than the topmost layer; and performing a second selective etching whose reaction is slow for the bottom layer of the upper mesa structure but is active for an etched layer to be the topmost layer of the lower mesa structure, wherein the first selective etching and the second selective etching are performed to leave an area corresponding to the lower mesa structure.

15. The method for manufacturing the semiconductor optical device according to claim 14, the method further comprising forming an etching mask to cover the area corresponding to the upper mesa structure, before performing the first selective etching.

16. The method for manufacturing the semiconductor optical device according to claim 14, wherein:

a base on which the multiple layers are deposited and the layer to be the topmost layer are made of indium phosphide, and the base under the multiple layers is etched in the second selective etching.

17. The method for manufacturing the semiconductor optical device according to claim 11, wherein the buried layer has a top horizontal surface that extends laterally outward beyond edges of the upper mesa structure, wherein the buried layer includes a projection extending above, with respect to a substrate of the semiconductor optical device, the top horizontal surface, and wherein the projection is in direct contact with the bottom surface of the bottom layer.

* * * * *